(12) United States Patent
Shen et al.

(10) Patent No.: US 11,410,901 B2
(45) Date of Patent: Aug. 9, 2022

(54) PACKAGE STRUCTURE AND MANUFACTURING METHOD THEREOF

(71) Applicant: WISTRON NEWEB CORPORATION, Hsinchu (TW)

(72) Inventors: Lee-Cheng Shen, Hsinchu (TW); Ying-Po Hung, Hsinchu (TW); Chao-Chieh Chan, Hsinchu (TW); Chao-Hsuan Wang, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 58 days.

(21) Appl. No.: 17/002,810

(22) Filed: Aug. 26, 2020

(65) Prior Publication Data

US 2021/0151358 A1   May 20, 2021

(30) Foreign Application Priority Data

Nov. 18, 2019   (TW) .................................. 108141726

(51) Int. Cl.
*H01L 23/31*   (2006.01)
*H01R 12/71*   (2011.01)
*H01L 21/56*   (2006.01)

(52) U.S. Cl.
CPC ........ *H01L 23/3121* (2013.01); *H01L 21/561* (2013.01); *H01L 23/3142* (2013.01); *H01R 12/716* (2013.01)

(58) Field of Classification Search
None
See application file for complete search history.

(56) References Cited

U.S. PATENT DOCUMENTS

2021/0066204 A1\*   3/2021   Oh .......................... H01L 23/552
2021/0118760 A1\*   4/2021   Yeh ....................... H01L 23/3192

FOREIGN PATENT DOCUMENTS

| CN | 105304508 A | 2/2016 |
| JP | 2009188086 A | 8/2009 |
| TW | 201605001 A | 2/2016 |

\* cited by examiner

*Primary Examiner* — Jay C Chang
(74) *Attorney, Agent, or Firm* — McClure, Qualey & Rodack, LLP

(57) ABSTRACT

A package structure and a manufacturing method thereof are provided. The package structure includes a circuit board, a barrier structure and a molding layer. The circuit board includes a substrate and a component disposed on the substrate. The substrate includes a molding area and a non-molding area, and the component is disposed on the molding area. The barrier structure is disposed on the substrate and located between the molding area and the non-molding area. The barrier structure has a first predetermined height. The molding layer is disposed on the molding area and covers the component. The molding layer has a second predetermined height. The first predetermined height of the barrier structure is less than or equal to the second predetermined height of the molding layer.

6 Claims, 19 Drawing Sheets

PACKAGE STRUCTURE AND MANUFACTURING METHOD THEREOF

CROSS-REFERENCE TO RELATED PATENT APPLICATION

This application claims the benefit of priority to Taiwan Patent Application No. 108141726, filed on Nov. 18, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a package structure and a manufacturing method thereof.

BACKGROUND OF THE DISCLOSURE

In related art, when packaging semiconductor components or systems, for the sake of the reliability of contact points of solder balls, expensive precision molds are required to be used in a molding process. In some special designs, a portion of a module is required to be protected by molding while another portion of the module should not be molded. Therefore, such selective molding requirement often results in increased mold cost, thereby increasing the overall cost of the module.

Therefore, how the cost of selective molding can be reduced through improving the designs of the manufacturing process and the package structure has become one important issue to be solved in this industry.

SUMMARY OF THE DISCLOSURE

In response to the above-referenced technical inadequacies, the present disclosure provides a package structure and a manufacturing method thereof.

In one aspect, the present disclosure provides a package structure including a circuit board, a barrier structure and a molding layer. The circuit board includes a substrate and a component disposed thereon, the substrate includes a molding area and a non-molding area, and the component is disposed on the molding area of the substrate. In addition, the substrate includes a first side surface, a second side surface and a third side surface connected between the first side surface and the second side surface. The barrier structure is disposed on the substrate, and the barrier structure is located between the molding area and the non-molding area, in which the barrier structure has a first predetermined height. The molding layer is disposed on the molding area of the substrate and covers the component, in which the molding layer has a second predetermined height, which is greater than or equal to the first determined height. In addition, the molding layer includes a first side face, a second side face, a third side face connected between the first side face and the second side face, and a fourth side face connected between the first side face and the second side face, and the fourth side face corresponds to the third side face. Furthermore, the first side surface, the second side surface and the third side surface are respectively flush with the first side face, the second side face and the third side face, and the barrier structure abuts against the fourth side face.

In another aspect, the present disclosure provides a manufacturing method of package structure including the following steps: providing a circuit board module including a substrate assembly, a first array component set disposed on the substrate assembly and a second array component set disposed on the substrate assembly, and the first array component set being arranged side by side with the second array component set, in which the substrate assembly includes a molding area and a non-molding area, and the first array component set and the second array component set are disposed on the molding area; forming a first barrier structure and a second barrier structure on the substrate assembly, in which the first array component set and the second array component set are disposed between the first barrier structure and the second barrier structure; coating an area between the first barrier structure and the second structure with a molding resin to form a molding structure completely covering the first array component set and the second array component set; and cutting the substrate assembly, the molding structure, the first barrier structure and the second barrier structure to form a plurality of package structures.

Therefore, one beneficial effect of the present disclosure is that the package structure and the manufacturing method thereof provided in the present disclosure can achieve selective molding packaging through the aspects of "a substrate includes a molding area and a non-molding area, and a component is disposed on the molding area of the substrate" or "a substrate assembly includes a molding area and a non-molding area, and a first array component set and a second array component set are disposed on the molding area".

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
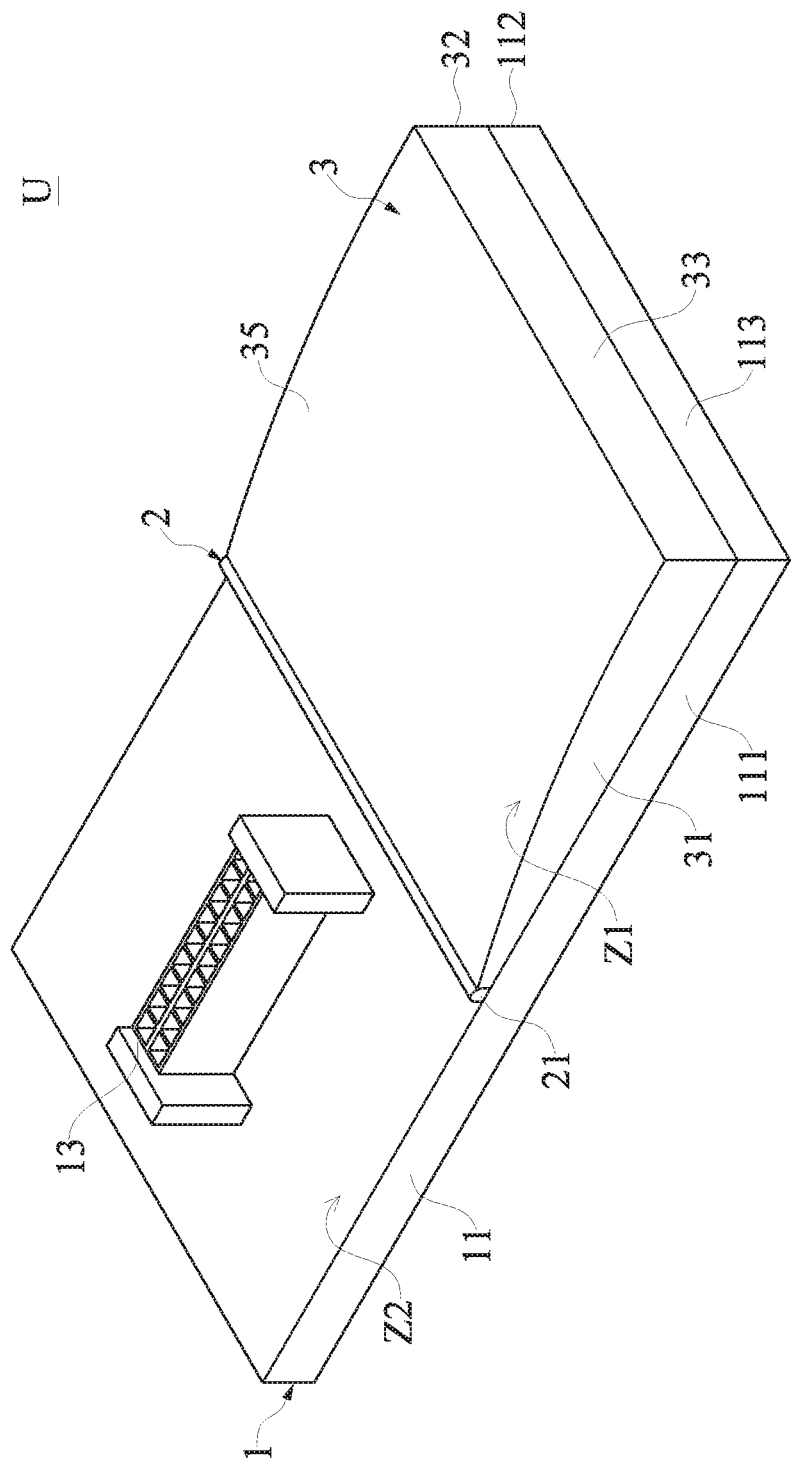
FIG. 1 is a perspective view of a package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
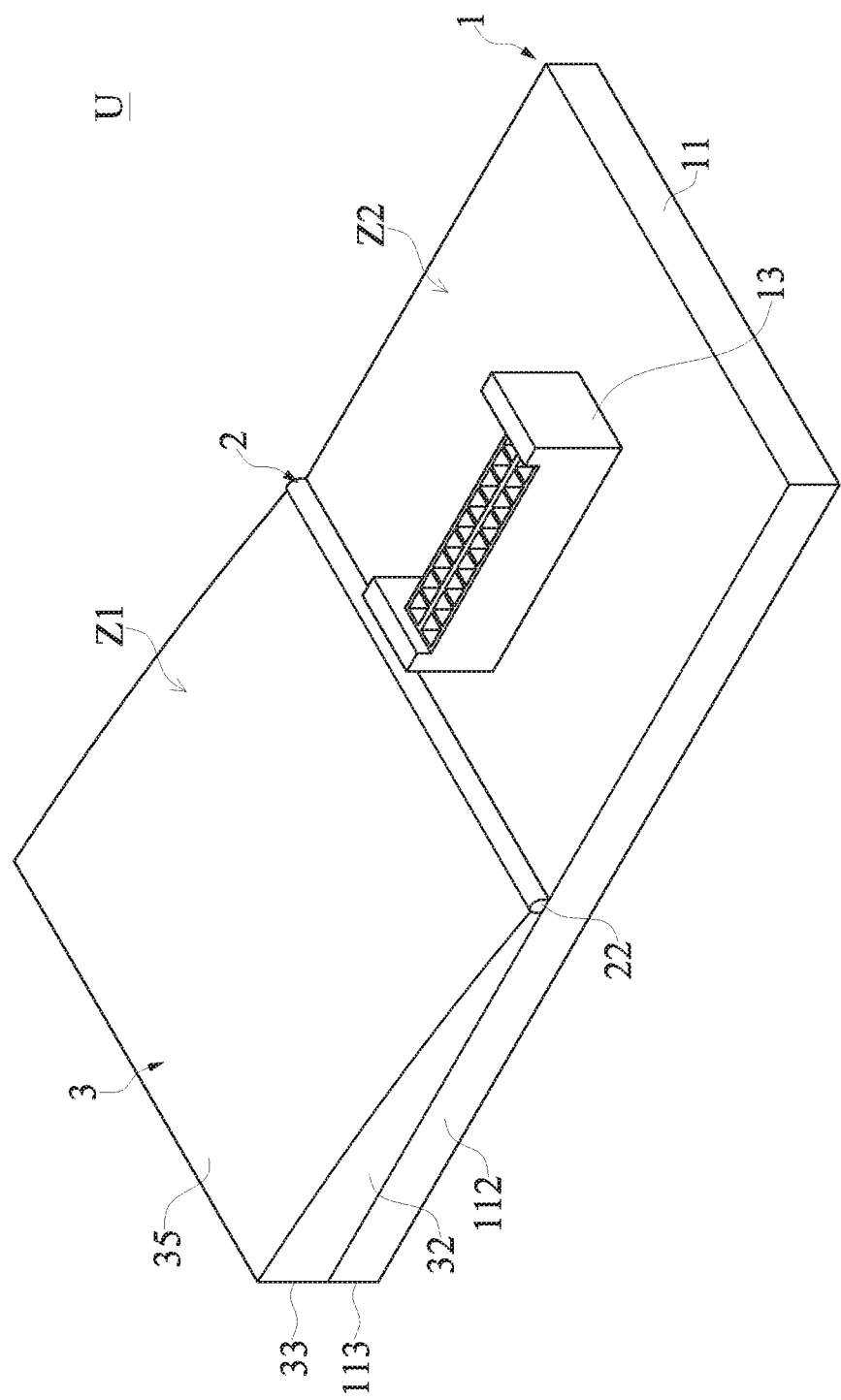
FIG. 2 is another perspective view of the package structure according to the first embodiment of the present disclosure.
Figure 3:
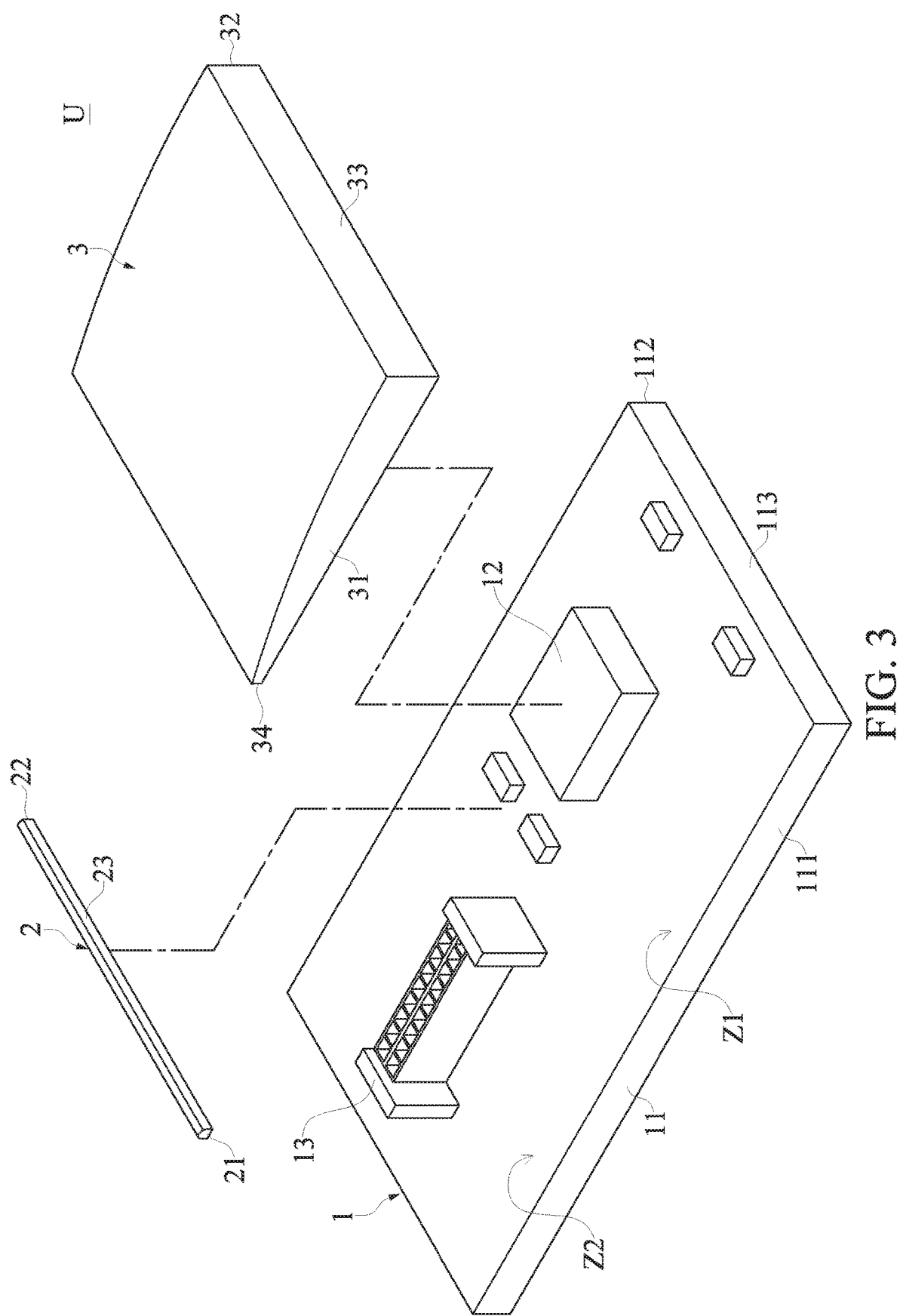
FIG. 3 is an exploded view of the package structure according to the first embodiment of the present disclosure.

Firstly, reference is made to FIG. 1, FIG. 2 and FIG. 3, which are a perspective view, an another perspective view and an exploded view of a package structure according to a first embodiment of the present disclosure. The present disclosure provides a package structure U and a manufacturing method thereof. The overall structure of the package structure U will be introduced in the first embodiment, and the manufacturing method of the package structure U will be described in a subsequent embodiment. In addition, it should be noted that, in certain embodiments, the package structure and the manufacturing method thereof provided in the present disclosure can be used for packaging semiconductor components, chips or circuitry. However, the present disclosure is not intended to be limited thereby.

Subsequently, the package structure U can include a circuit board 1, a barrier structure 2 and a molding layer 3. The circuit board 1 can include a substrate 11 and a component 12 disposed on the substrate 11. For example, the circuit board 1 can be a printed circuit board (PCB), and the component 12 can be a circuit, a chip, an electronic component or a circuit composed of electronic components disposed on the substrate 11. However, the present disclosure is not intended to be limited thereby. It should be noted that the component 12 is exemplified as being multiple chips in the figures of the present disclosure. In addition, the circuit board 1 can further include a connecting port 13 to connect to an external connecting terminal (omitted in the figures of the present disclosure) or cable (omitted in the figures of the present disclosure).

Furthermore, the substrate 11 includes a molding area Z1 and a non-molding area Z2. The component 12 can be disposed on the molding area Z1 of the substrate 11, and the connecting port 13 can be disposed on the non-molding area Z2 of the substrate 11. It should be noted that, in the present disclosure, the molding area Z1 represents to an area on the substrate 11 covered by the molding layer 3, and the non-molding area Z2 represents to an area on the substrate 11 not covered by the molding layer 3. Therefore, the component 12 can be covered by the molding layer 3, and the connecting port 13 can be exposed relative to the molding layer 3. In addition, it should be noted that, although the connecting port 13 is exemplified to be disposed on the non-molding area Z2 of the substrate 11 in the present disclosure, in other embodiments, other members (e.g., chips or electronic components) can be disposed on the non-molding area Z2 of the substrate 11, and the present disclosure is not intended to be limited by the type of the members disposed on the non-molding area Z2.

In addition, the barrier structure 2 can be disposed on the substrate 11 and located between the molding area Z1 and the non-molding area Z2 to isolate the molding area Z1 and the non-molding area Z2. The molding layer 3 can be disposed on the molding area Z1 of the substrate 11 and covers the component 12, and the connecting port 13 can be exposed relative to the molding layer 3. In addition, for instance, materials of the barrier structure 2 and the molding layer 3 can both at least include epoxy. However, the present disclosure is not intended to be limited thereby. It should be noted that, in other embodiments, the materials of the barrier structure 2 and the molding layer 3 can at least include silicone or other resins as well. However, the present disclosure in not intended to be limited thereby. In other words, the barrier structure 2 and the molding layer 3 can be made of a cured resin. Preferably, in one of the embodiments, the materials of the barrier structure 2 and the molding layer 3 are different. It should be noted that the materials of the barrier structure 2 and the molding layer 3 can be completely different. On the other hand, the materials of the barrier structure 2 and the molding layer 3 can both include the same essential material (e.g., the barrier structure 2 and the molding layer 3 both include epoxy or silicone but are not limited thereto), and the materials of the barrier structure 2 and the molding layer 3 are respectively added with materials of different properties, such that the material properties or the colors of the barrier structure 2 and the molding layer 3 are different. However, in one of the embodiments, the materials of the barrier structure 2 and the molding layer 3 can be the same as well.

Figure 4:
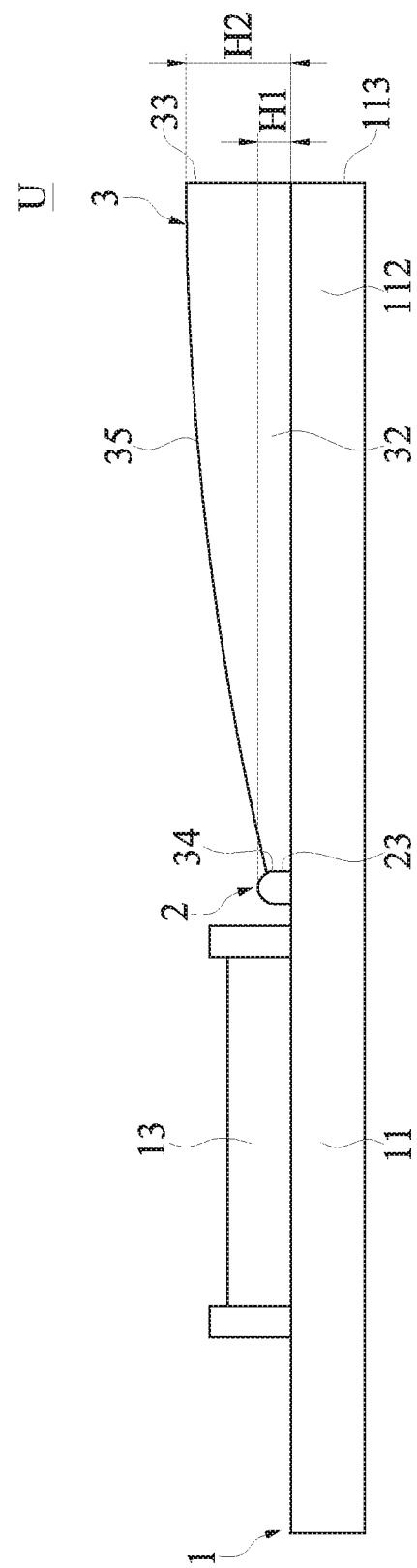
FIG. 4 is a side view of the package structure according to the first embodiment of the present disclosure.
Figure 5:
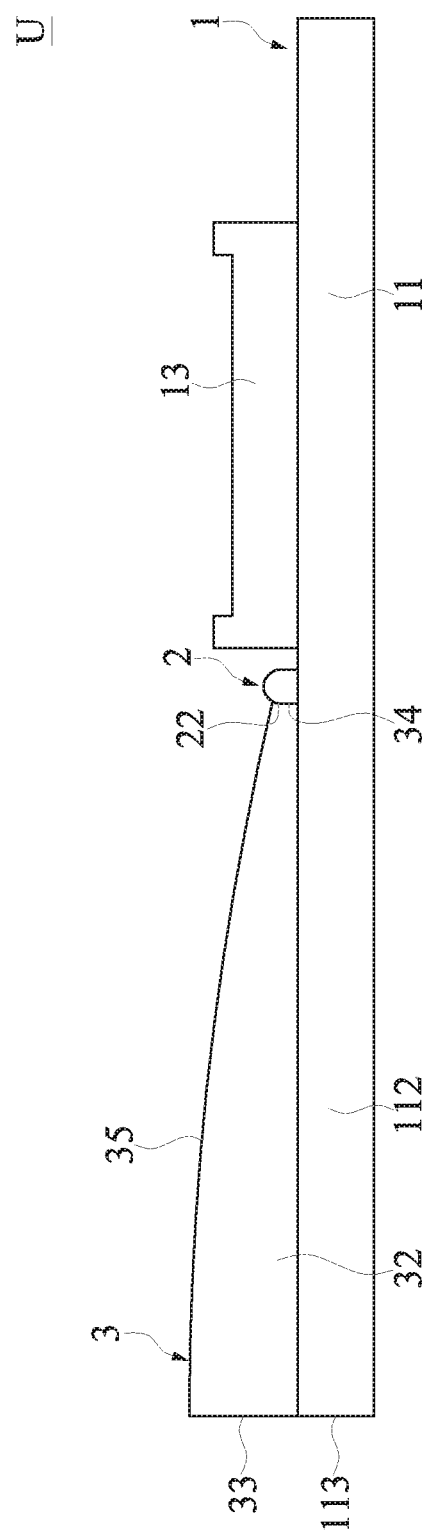
FIG. 5 is another side view of the package structure according to the first embodiment of the present disclosure.

Furthermore, reference is made to FIG. 4 and FIG. 5. FIG. 4 and FIG. 5 are two side views of the package structure according to the first embodiment of the present disclosure, and are to be read in conjunction with FIG. 1, FIG. 2 and FIG. 3. In detail, the substrate 11 can include a first side surface 111, a second side surface 112 and a third side surface 113 connected between the first side surface 111 and the second side surface 112. The molding layer 3 can be disposed to be adjacent to the third side surface 113. In addition, the molding layer 3 can include a first side face 31, a second side face 32, a third side face 33 connected between the first side face 31 and the second side face 32 and a fourth side face 34 connected between the first side face 31 and the second side face 32. The fourth side face 34 corresponds to the third side face 33. Furthermore, in one of the embodiments, the first side surface 111, the second side surface 112 and the third side surface 113 of the substrate 11 are respectively flush with the first side face 31, the second side face 32 and the third side face 33 of the molding layer 3, and the barrier structure 2 can abut against the fourth side face 34 of the molding layer 3.

Referring to the foregoing descriptions, furthermore, in the present disclosure, the barrier structure 2 can abut against the fourth side face 34 of the molding layer 3 while not in contact with the first side face 31, the second side face 32 and the third side face 33. In addition, it should be noted that, in one of the preferred embodiment, the package structure U of the present disclosure has only one barrier structure 2 formed on one side of the molding layer 3. In other words, only one side of the molding layer 3 has the barrier structure 2 provided thereon, and the other sides are the bare surface of the mold layer 3 itself.

Referring to the foregoing descriptions, the barrier structure 2 can include a first end face 21, a second end face 22 corresponding to the first end face 21, and an abutment face 23 connected between the first end face 21 and the second end face 22. Furthermore, in one of the embodiments, the abutment face 23 of the barrier structure 2 can abut against the fourth side face 34 of the molding layer 3. The first end face 21 and the second end face 22 of the barrier structure 2 are flush with the first side surface 111 and the second side surface 112 of the substrate 11, respectively. In other words, the first side surface 111 of the substrate 11, the first side face 31 of the molding layer 3 and the first end surface 21 of the barrier structure 2 are flush with each other, and the second side surface 112 of the substrate 11, the second side face 32 of the molding layer 3 and the second end surface 22 of the barrier structure 2 are flush with each other.

Subsequently, furthermore, in the present disclosure, the barrier structure 2 can have a first predetermined height H1, and the molding layer 3 can have a second predetermined height H2. The first predetermined height H1 can be less than or equal to the second predetermined height H2. Preferably, the first predetermined height H1 is less than the second predetermined height H2. In addition, in one of the embodiments, the first predetermined height H1 can be greater than one third of the second predetermined height H2, in other words, ⅓H2≤H1≤H2. In addition, it is worth mentioning that, in the present disclosure, the second predetermined height H2 can decrease from the third side face 33 of the molding layer 3 toward the fourth side face 34 of the molding layer 3. In other words, the closer to the barrier structure 2, the second predetermined height H2 of the molding layer 3 is lesser. It should be noted that, in one of the embodiments, the first predetermined height H1 of the barrier structure 2 refers to the greatest height of the barrier structure 2, and the second predetermined height H2 of the barrier layer 3 refers to the greatest height of the barrier layer 3.

Figure 18:
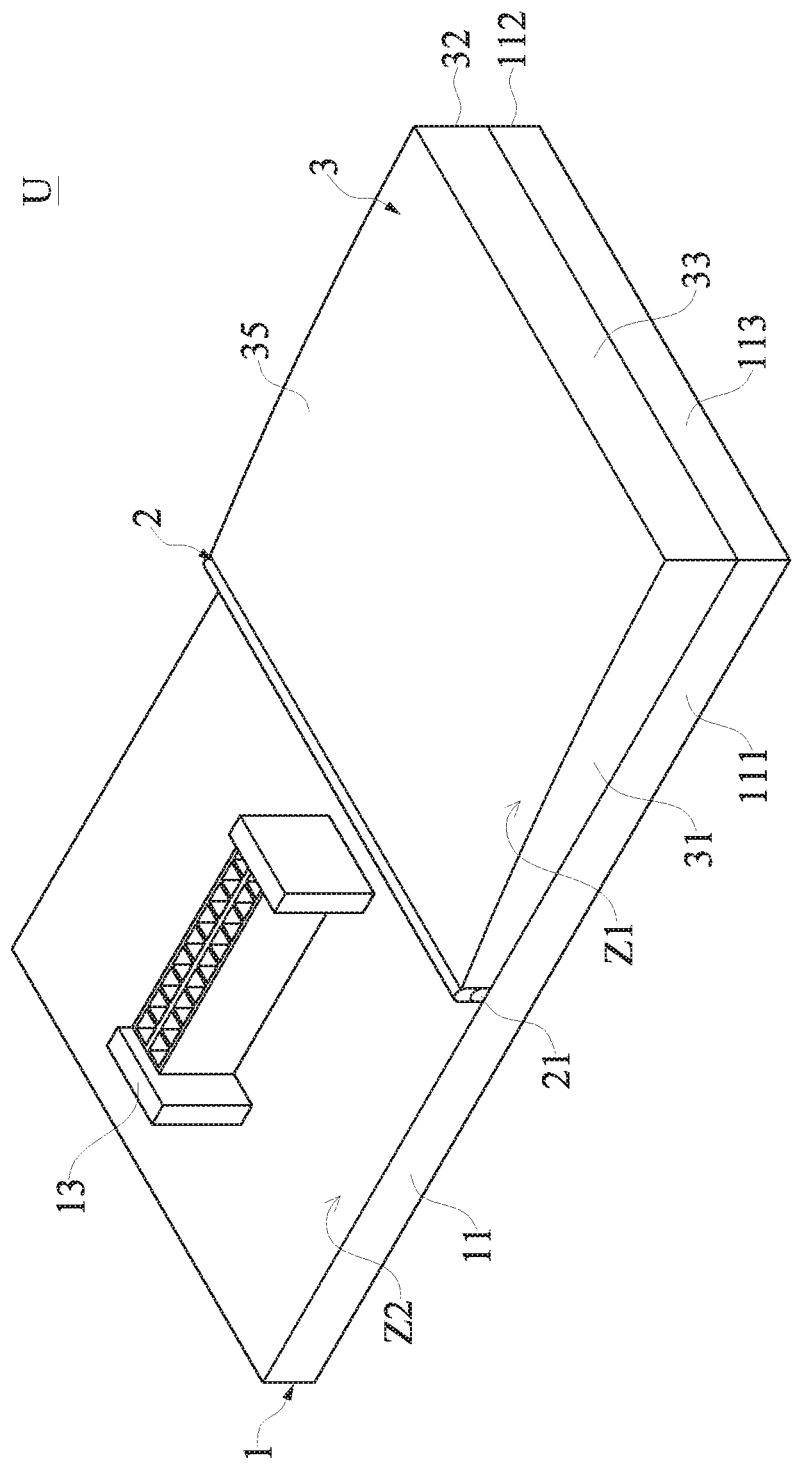
FIG. 18 is a perspective view of a package structure according to another implementation of the present disclosure.
Figure 19:
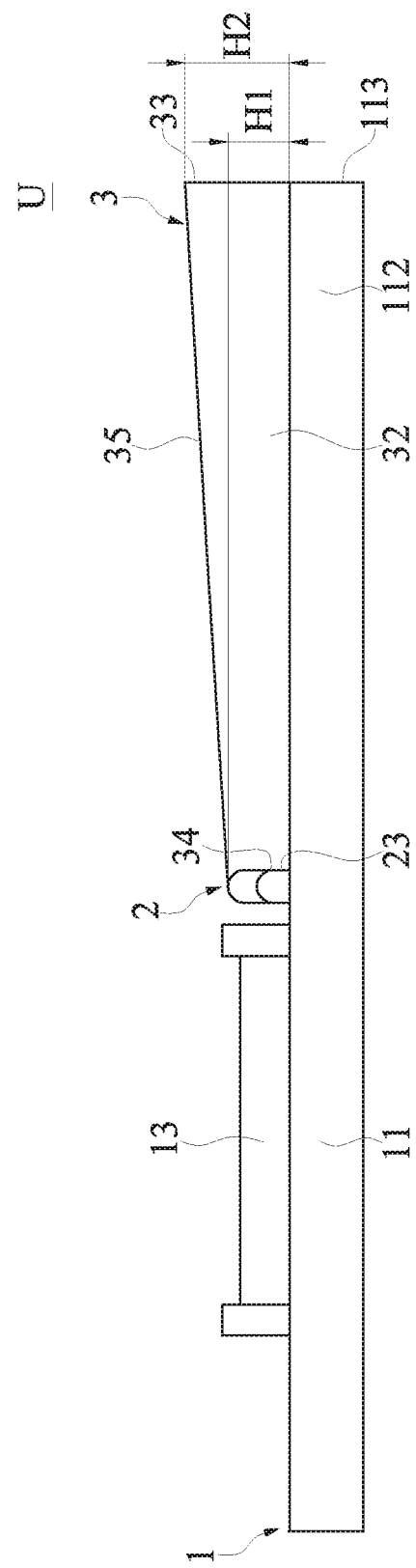
FIG. 19 is a side view of the package structure according to another implementation of the present disclosure.

Referring to the foregoing descriptions, the molding layer 3 can further include a top face 35, and the top face 35 can be connected between the first side face 31, the second side face 32, the third side face 33 and the fourth side face 34. In one of the embodiments, the top surface 35 of the molding layer 3 can be arced or curved to form a sloped top face 35, and the second predetermined height H2 of the molding layer 3 decreases from the molding area Z1 toward the non-molding area Z2. However, the present disclosure is not intended to be limited thereby. In other embodiments, the first predetermined height H1 of the barrier structure and the amount of molding layer 3 can be increased, so that the slope of the sloped top face 35 would be relatively gentler (as shown in FIG. 18 and FIG. 19).

Second Embodiment

Figure 6:
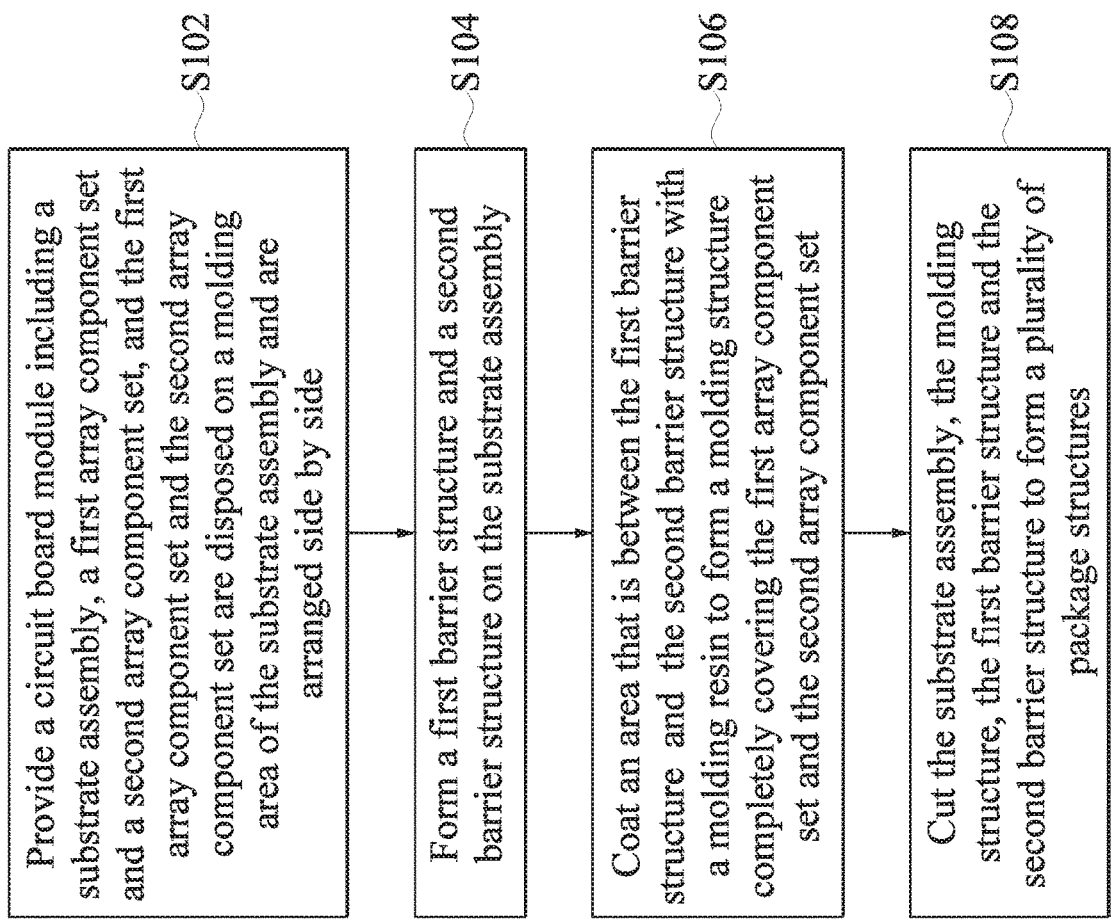
FIG. 6 is a flow chart of a manufacturing method of package structure according to a second embodiment of the present disclosure.

Firstly, referring to FIG. 6, and read in conjunction with FIG. 9 to FIG. 16. FIG. 6 is a flow chart of a package structure according to a second embodiment of the present disclosure, and FIG. 9 to FIG. 16 are schematic views of a manufacturing process of the package structure according to the second embodiment of the present disclosure, correspondingly. It should be noted that the features of each component in the manufacturing method of the package structure U provided in the second embodiment are similar to those introduced in the above-mentioned embodiments, and descriptions are omitted herein.

Figure 9:
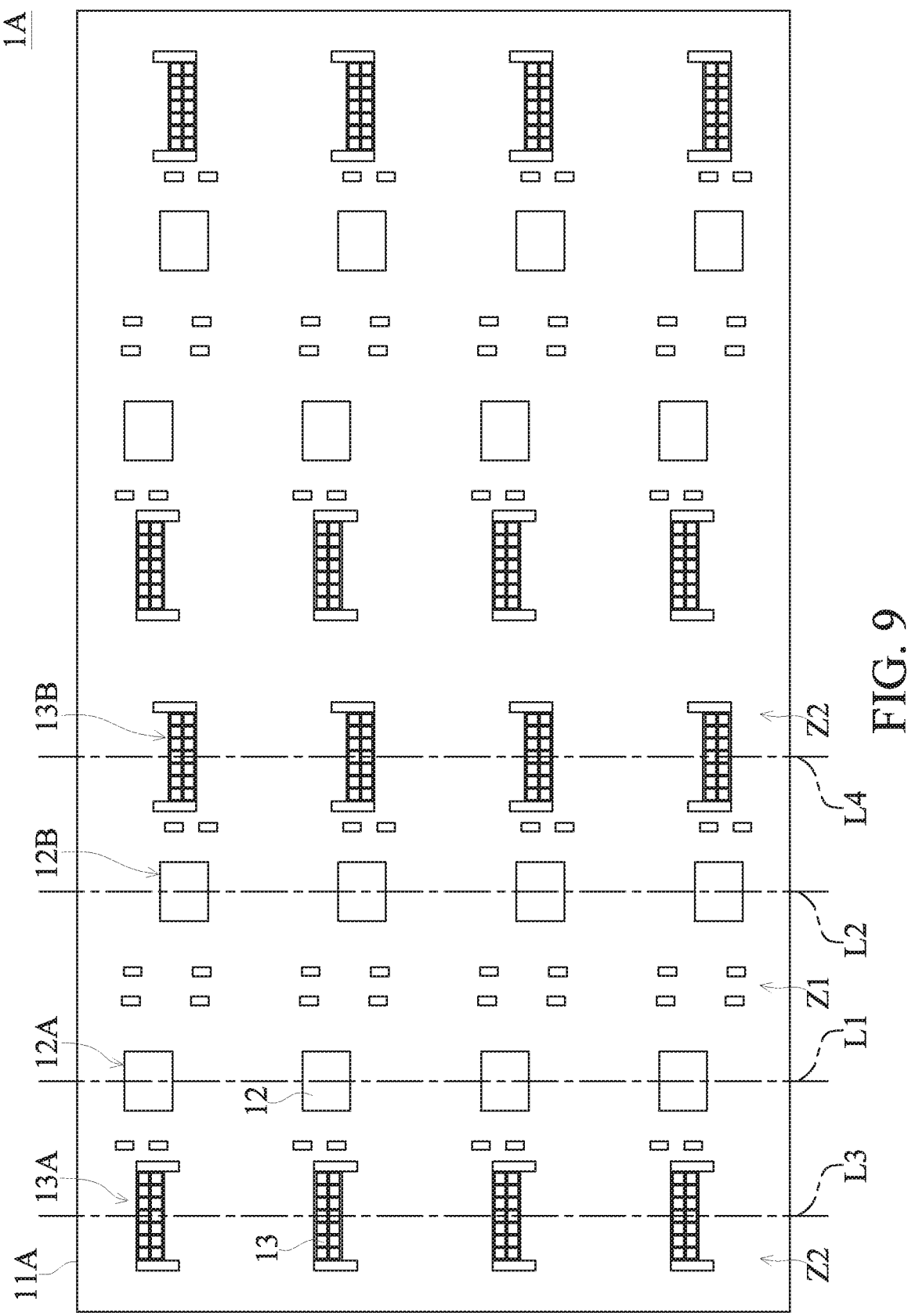
FIG. 9 is a schematic view of a manufacturing process of a package structure according to the second embodiment of the present disclosure.

Subsequently, reference is made to FIG. 6 and FIG. 9. As shown in a step S102, a circuit board module 1A can be provided. The circuit board module 1A can include a substrate assembly 11A, a first array component set 12A and a second array component set 12B. The first array component set 12A and the second array component set 12B are disposed on a molding area Z1 of substrate assembly 11A, and the first array component set 12A is arranged side by side with the second array component set 12B. In detail, the substrate assembly 11A can be composed of a plurality of substrates 11 (which are still connected together without being cut, as introduced in the above-mentioned embodiments). The substrate assembly 11A can include at least one molding area Z1 and at least one non-molding area Z2. It should be noted that, in the present disclosure, the molding area Z1 represents an area on the substrate 11 covered by the molding layer 3 in a subsequent manufacturing process, and the non-molding area Z2 represents an area on the substrate 11 not being covered by the molding layer 3 in the subsequent manufacturing process.

Referring to the foregoing descriptions, the first array component set 12A and the second array component set 12B can be disposed on the substrate assembly 11A, the first array component 12A and the second array component 12B can be disposed on the molding area Z1, and the first array component 12A is arranged side by side with the second array component 12B. Furthermore, the first array component set 12A can include a plurality of components 12 arranged at intervals along a first predetermined axis L1, the second array component set 12B can include a plurality of components 12 arranged at intervals along a second predetermined axis L2, and the first predetermined axis L1 is parallel with the second predetermined axis L2. In other words, the first array component set 12A can be composed of the components 12 (which is introduced in the above-mentioned embodiments) along the first predetermined axis L1, and the second array component set 12B can be composed of the components 12 (which is introduced in the above-mentioned embodiments) along the second predetermined axis L2. In addition, it should be noted that, in the present disclosure, the first array component set 12A is arranged to be inverted to the adjacent second array component set 12B.

Referring to the foregoing descriptions, for instance, based on the vertical projections of the two side by side arranged adjacent components 12 on the substrate assembly 11A, a first projection contour can be formed by a vertical projection of one of the components 12 of the first array component set 12A on the substrate assembly 11A, a second projection contour can be formed by a vertical projection of one of the components 12 of the second array component set 12B on the substrate assembly 11A, and the second projection contour is vertically and horizontally inverted to the first projection contour. In other words, when a positioning point (which is not labeled in the figures of the present disclosure) is defined on one of the components 12 of the first array component set 12A, the shape of the second projection contour is the same with the shape of the first projection contour that is rotated by 180 degrees with the positioning point as the axis along a surface of the substrate assembly 11A.

Referring to the foregoing descriptions, preferably, in one of the embodiments, in a step of providing the circuit board module 1A, the circuit board module 1A can further include a first array connecting port set 13A and a second array connecting port set 13B. The first array connecting port set 13A and the second array connecting port set 13B can be disposed on the substrate assembly 11A and the non-molding area Z2. In addition, the first array connecting port set 13A can include a plurality of connecting ports 13 arranged at intervals along a third predetermined axis L3, the second array connecting port set 13B can include a plurality of connecting ports 13 arranged at intervals along a fourth predetermined axis L4, and the third predetermined axis L3 is parallel with the fourth predetermined axis L4. Furthermore, the first array component set 12A and the second array component set 12B can be disposed between the first array connecting port set 13A and the second array connecting port set 13B. The first array connecting port set 13A can be composed of the connecting ports 13 (which is introduced in the above-mentioned embodiments) along the third predetermined axis L3, and the second array connecting port set 13B can be composed of the connecting ports 13 (which is introduced in the above-mentioned embodiments) along the fourth predetermined axis L4. In addition, it should be noted that, in the present disclosure, the first array connecting port set 13A is arranged to be inverted to the adjacent second array connecting port set 13B.

Referring to the foregoing descriptions, for instance, based on the vertical projections of the two side by side arranged adjacent connecting ports 13 on the substrate assembly 11A, a third projection contour can be formed by a vertical projection of one of the connecting ports 13 of the first array connecting port set 13A on the substrate assembly 11A, a fourth projection contour can be formed by a vertical projection of one of the connecting ports 13 of the second array connecting port set 13B on the substrate assembly 11A, and the fourth projection contour is vertically and horizontally inverted to the third projection contour. In other words, when a positioning point (which is not labeled in the figures of the present disclosure) is defined on one of the connecting ports 13 of the first array connecting port set 13A, the shape of the fourth projection contour is the same with the shape of the third projection contour rotated by 180 degrees with the positioning point as the axis along a surface of the substrate assembly 11A.

Figure 10:
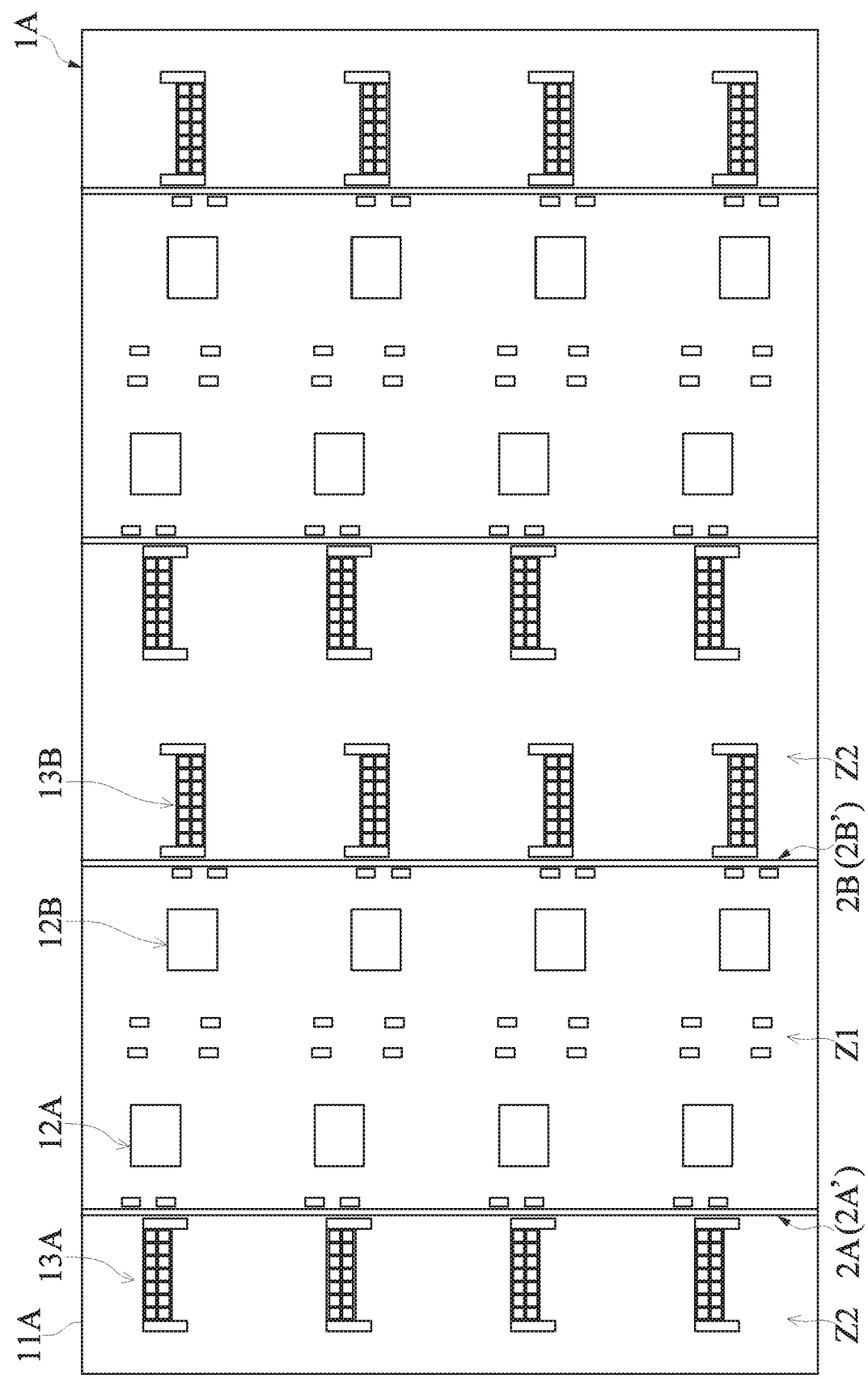
FIG. 10 is another schematic view of the manufacturing process of the package structure according to the second embodiment of the present disclosure.
Figure 11:
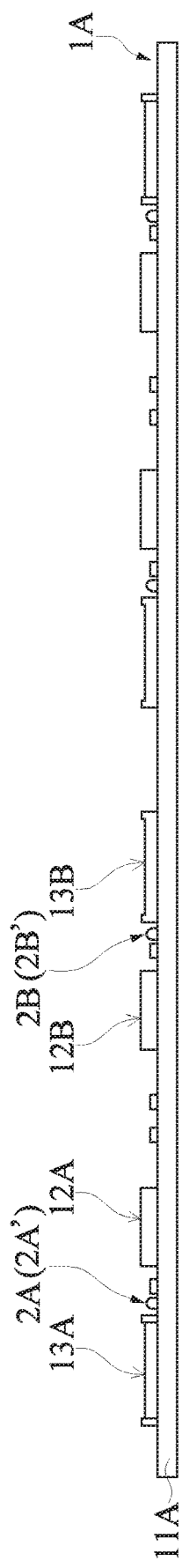
FIG. 11 is a front view of FIG. 10.

Thereafter, reference is made to FIG. 6, FIG. 10 and FIG. 11. As shown in a step S104, a first barrier structure 2A' and a second barrier structure 2B' can be formed on the substrate assembly 11A. In detail, the first array component set 12A and the second array component set 12B can be disposed between the first barrier structure 2A' and the second barrier structure 2B', and the molding area Z1 is located between the first barrier structure 2A' and the second barrier structure 2B'.

Figure 7:
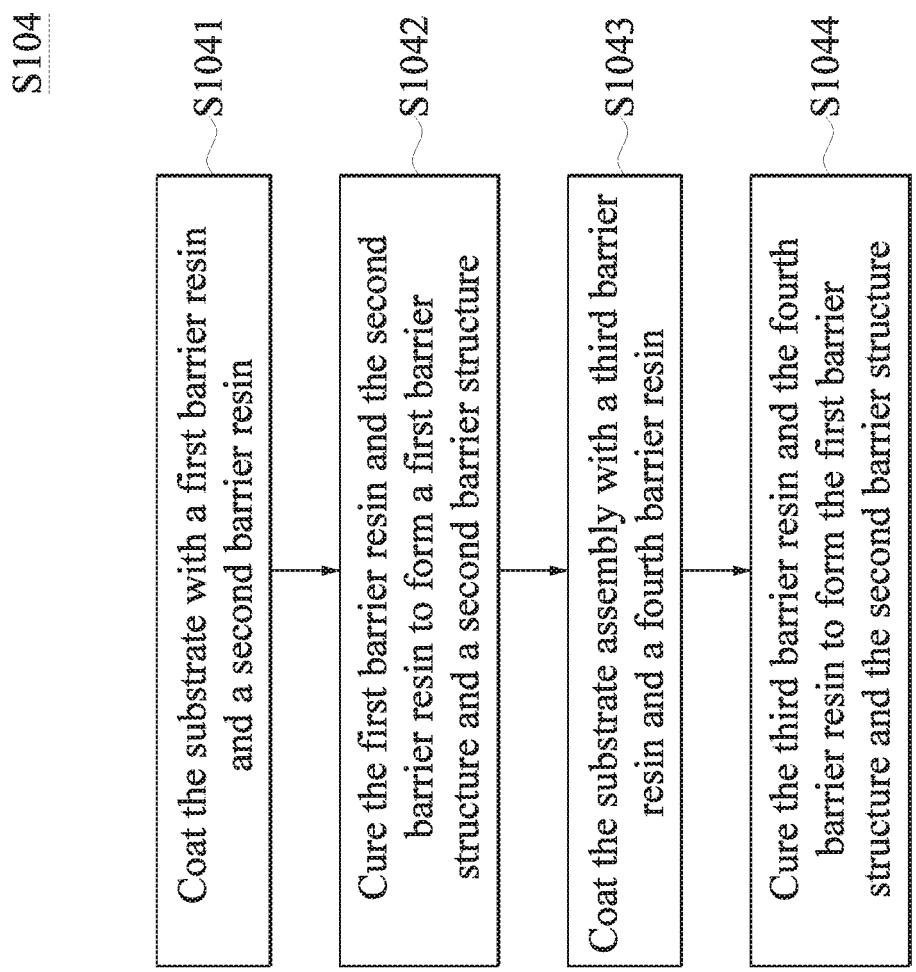
FIG. 7 is a flow chart of a step S104 of the manufacturing method of package structure according to the second embodiment of the present disclosure.

Referring to the foregoing descriptions, and referring to FIG. 6, FIG. 10 and FIG. 11, and read in conjunction with FIG. 7. FIG. 7 is a flow chart of the step S104 of the manufacturing method of package structure according to the second embodiment of the present disclosure. In other words, the process of forming a first barrier structure 2A' and a second barrier structure 2B' on the substrate assembly 11A is shown in FIG. 7. As shown in a step S1041, a first barrier resin 2A and a second barrier resin 2B can be coated on the substrate assembly 11A. In detail, the first array component set 12A and the second array component set 12B can be disposed between the first barrier resin 2A and the second barrier resin 2B, and one molding area Z1 can be located between the first barrier structure 2A' and the adjacent second barrier structure 2B'. In addition, it should be noted that, in a preferred embodiment, in a step of coating the substrate assembly 11A with the first barrier resin 2A and the second barrier resin 2B, the first barrier resin 2A and the second barrier resin 2B can be coated along a predetermined direction (for instance, from top to bottom as exemplified in the figure), and for the sake of reducing the processing time and cost, the substrate assembly 11A can be only coated along the predetermined direction once. However, in other embodiments, the substrate assembly 11A can be coated with the first barrier resin 2A and the second barrier resin 2B multiple times to form a higher first barrier structure 2A' and a higher second barrier structure 2B'.

Referring to the foregoing descriptions, as shown in a step S1042, the first barrier resin 2A and the second barrier resin 2B can be cured to form the first barrier structure 2A' and the second barrier structure 2B'. For instance, in a step of curing the first barrier resin 2A and the second barrier resin 2B, the first barrier resin 2A and the second barrier resin 2B can be cured through spontaneous curing or thermal curing to form the cured and/or shaped first barrier structure 2A' and the cured and/or shaped second barrier structure 2B'. For instance, thermal curing can be performed by baking. Furthermore, it should be noted that the first barrier structure 2A' and the second barrier structure 2B' can be separately composed by the barrier structures 2 (which are still connected together without being cut and are introduced in the above-mentioned embodiments). In addition, the first barrier resin 2A and the second barrier resin 2B are the first barrier structure 2A' before being cured and the second barrier structure 2B' before being cured, respectively. Furthermore, the materials and properties of the first barrier resin 2A and the second barrier resin 2B have been introduced in the above-mentioned embodiments, and descriptions are omitted herein. Furthermore, it should be noted that, in a step of forming the shaped first barrier structure 2A' and the shaped second barrier structure 2B' by curing the first barrier resin 2A and the second barrier resin 2B through spontaneous curing or thermal curing, the first barrier structure 2A' and the second barrier structure 2B' can be firmly disposed on the substrate assembly 11A by only curing the outer surfaces of the first barrier structure 2A' and the second barrier structure 2B'.

Referring to the foregoing descriptions, it should be noted that, in one of the embodiments, in the step of coating the substrate assembly 11A with the first barrier resin 2A and the second barrier resin 2B, for the sake of reducing the processing time and cost, the substrate assembly 11A can be only coated with the first barrier resin 2A and the second barrier resin 2B along a predetermined direction once. Therefore, when performing the process according to the flow chart of the step S104 which is shown in FIG. 7, it may only perform the steps S1041 and S1042.

Figure 17:
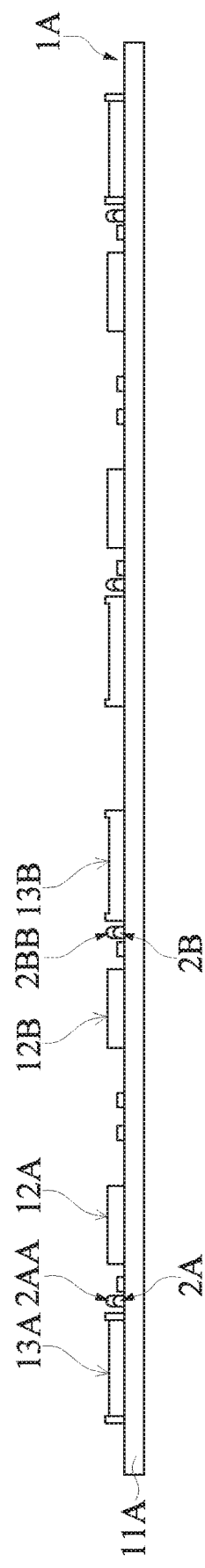
FIG. 17 is a schematic view of another implementation of a manufacturing process of package structure according to the present disclosure.

Referring to the foregoing descriptions, it should be noted that, in another embodiment, for the sake of forming the first barrier structure 2A' and the second barrier structure 2B' having higher heights, the barrier resin coating process may be performed again. In detail, reference is made to FIG. 17 and FIG. 7. As shown in a step S1043, a third barrier resin 2AA and a fourth barrier resin 2BB can be coated on the substrate assembly 11A. In detail, for the sake of increasing the height of the barrier structures, the third barrier resin 2AA and the fourth barrier resin 2BB can be coated on the first barrier resin 2A and the second barrier resin 2B, respectively. In other words, after the step of coating the substrate assembly 11A with the first barrier resin 2A and the second barrier resin 2B, the third barrier resin 2AA can be coated on the first barrier resin 2A, and the fourth barrier resin 2BB can be coated on the second barrier resin 2B.

Referring to the foregoing descriptions, furthermore, as shown in a step S1044, the third barrier resin 2AA and the fourth barrier resin 2BB can be cured to form the first barrier structure 2A' and the second barrier structure 2B'. In detail, in a step of curing the third barrier resin 2AA and the fourth barrier resin 2BB, the third barrier resin 2AA and the fourth barrier resin 2BB can be cured through spontaneous curing or thermal curing to form the cured and/or shaped first barrier structure 2A' and the cured and/or shaped second barrier structure 2B'. Therefore, the heights of the formed first barrier structure 2A' and the formed second barrier structure 2B' would be higher. Moreover, it should be noted that, the methods of curing the third barrier resin 2AA and the fourth barrier resin 2BB are the same with the methods of curing the first barrier resin 2A and the second barrier resin 2B, and descriptions will be omitted herein.

Figure 12:
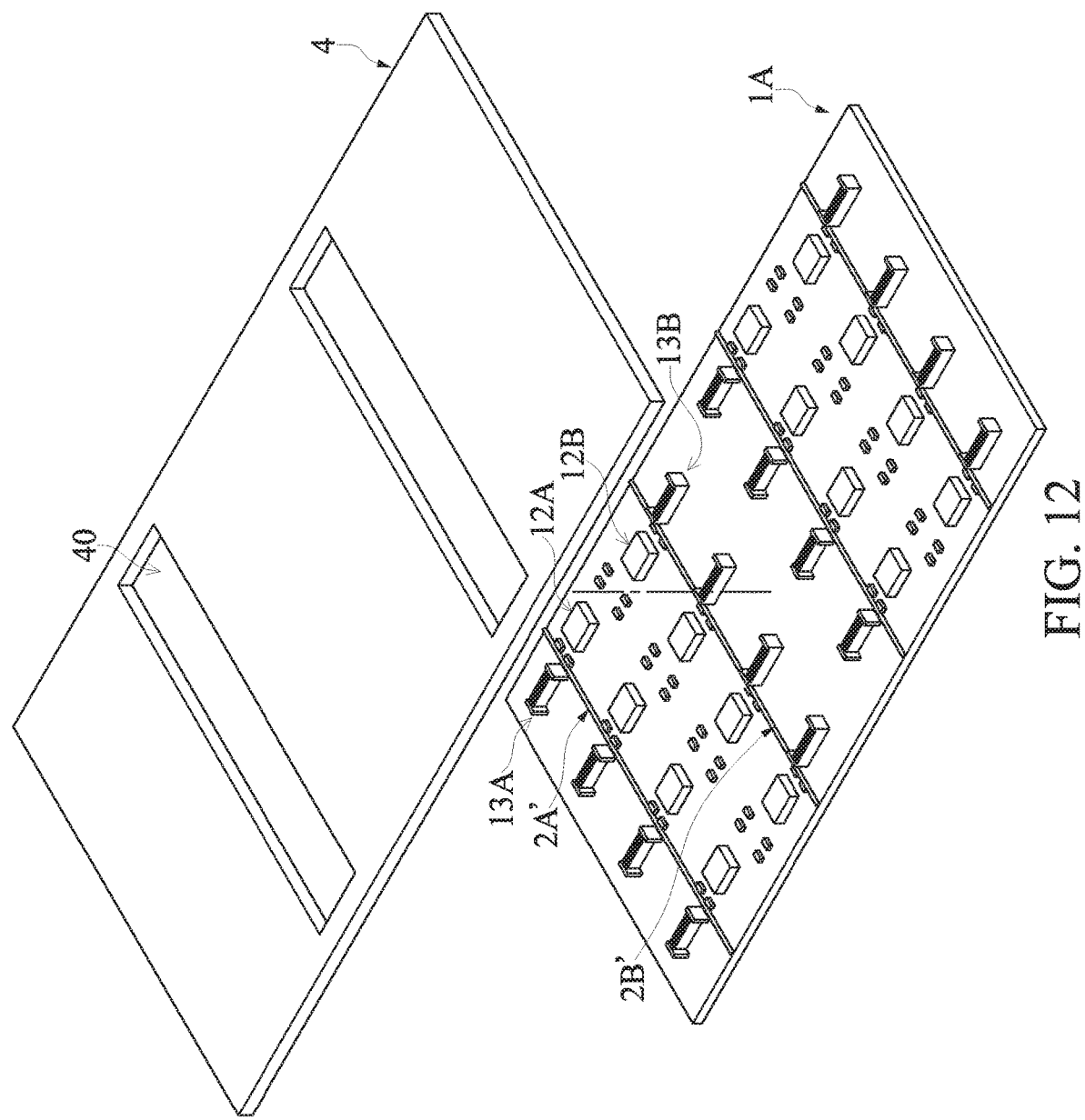
FIG. 12 is a yet another schematic view of the manufacturing process of the package structure according to the second embodiment of the present disclosure.
Figure 13:
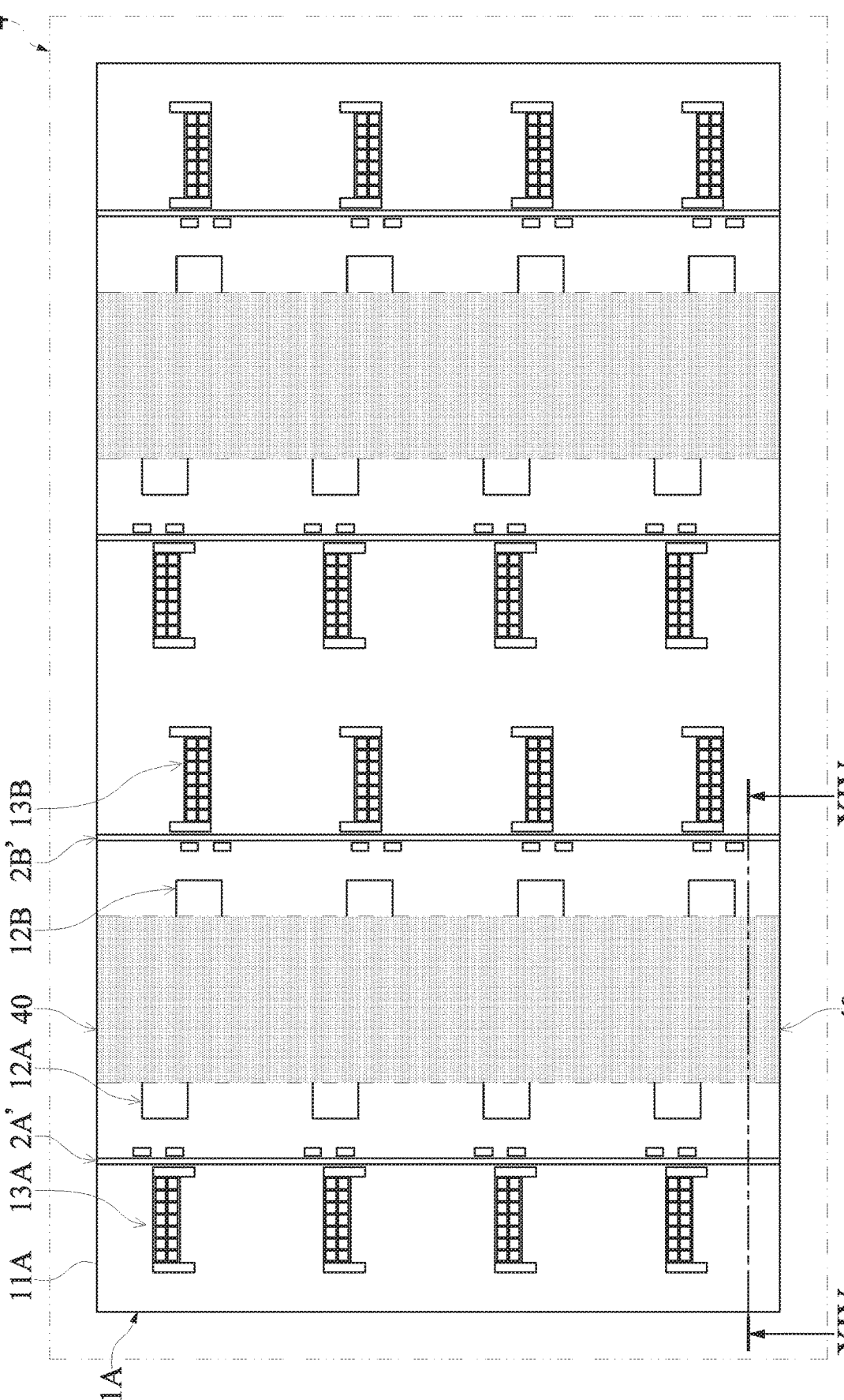
FIG. 13 is a further another schematic view of the manufacturing process of the package structure according to the second embodiment of the present disclosure.
Figure 14:
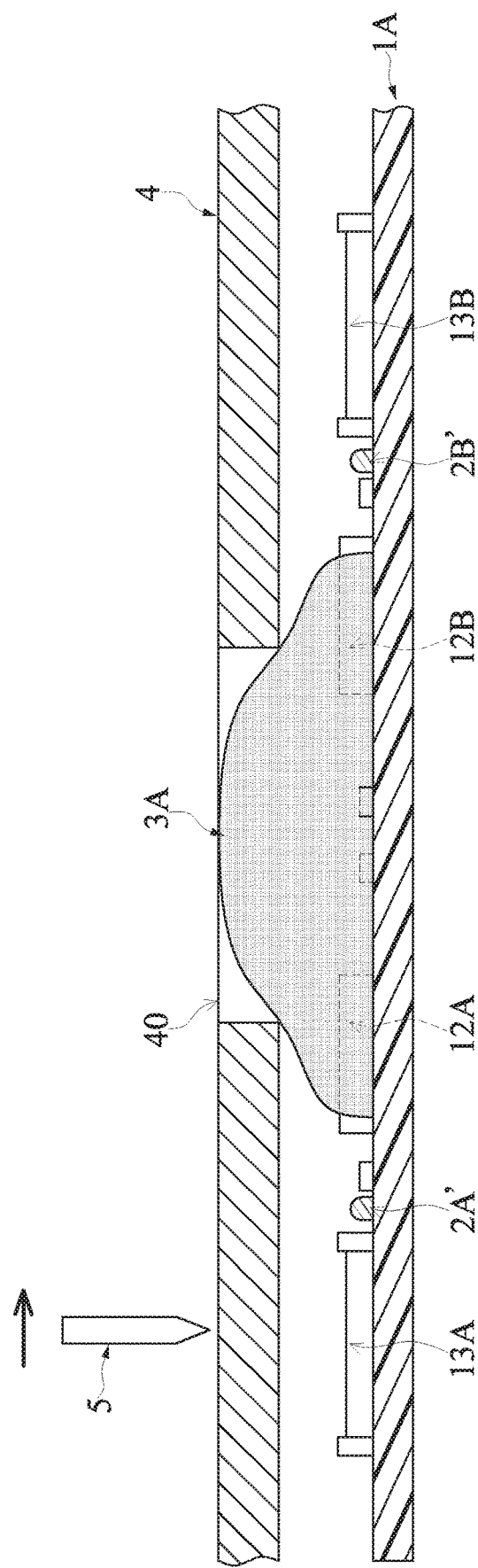
FIG. 14 is a sectional view taken along line XIV-XIV of FIG. 13.

Thereafter, referring to FIG. 6, and read in conjunction with FIG. 12, FIG. 13 and FIG. 14. An embodiment of performing only the steps S1041 and S1042 will be introduced below first. As shown in a step S106, a molding resin 3A can be coated on an area between the first barrier structure 2A' and the second barrier structure 2B' to form a molding structure 3A' completely covering the first array component set 12A and the second array component set 12B. In detail, the molding structure 3A' can be formed by a plurality of molding layers 3 (which are still connected together without being cut). In addition, the molding resin 3A is the molding structure 3A' before the molding structure 3A' is cured. It should be noted that, in a step of coating the area between the first barrier structure 2A' and the second barrier structure 2B' with the molding resin 3A, the molding resin 3A coating process is performed under a vacuum environment with a predetermined vacuum pressure. In other words, the molding resin 3A can be coated on the area between the first barrier structure 2A' and the second barrier structure 2B' by using a vacuum printing encapsulation system (VPES). However, the present disclosure in not limited thereby. In other embodiments, in the step of coating the area between the first barrier structure 2A' and the second barrier structure 2B' with the molding resin 3A, the molding resin 3A coating process can also be performed under an environment with atmospheric pressure. Furthermore, it should be noted that, the material and the properties of the molding resin 3A have been introduced in the above-mentioned embodiments, and descriptions are omitted herein.

Figure 8:
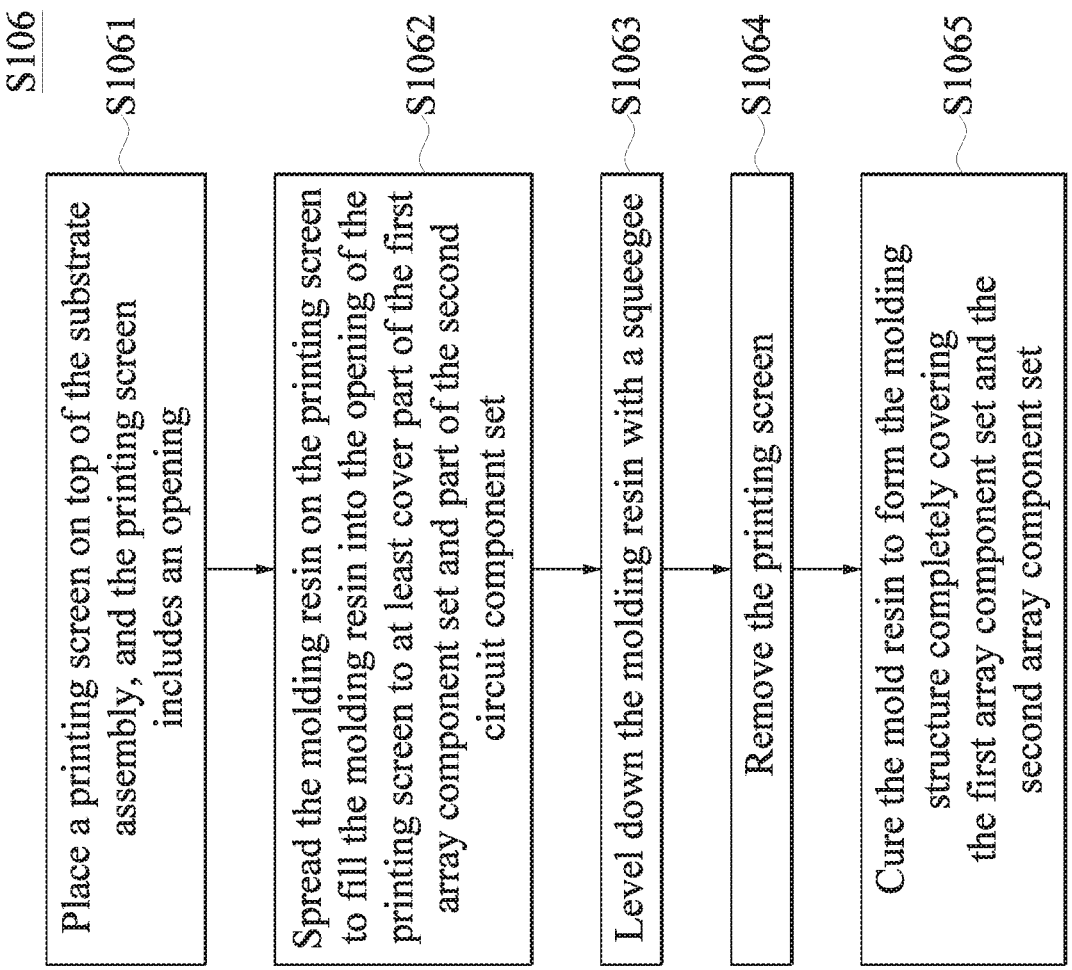
FIG. 8 is a flow chart of a step S106 of the manufacturing method of package structure according to the second embodiment of the present disclosure.

Referring to the foregoing descriptions, and referring to FIG. 6, FIG. 12, FIG. 13 and FIG. 14, and read in conjunction with FIG. 8. FIG. 8 is a flow chart of the step S106 of the manufacturing method of package structure according to the second embodiment of the present disclosure. In other words, the process of forming the molding structure 3A' completely covering the first array component set 12A and the second array component set 12B on the substrate assembly 11A is shown in FIG. 8. As shown in a step S1061, a printing screen 4 can be placed on top of the substrate assembly 11A. The printing screen 4 includes an opening 40 to allow the molding resin 3A to be filled and coated on the molding area Z1 through the opening 40. In addition, a vertical projection of the molding area Z1 between the first barrier structure 2A' and the second barrier structure 2B' on the substrate assembly 11A is at least partially overlapped with a vertical projection of the opening 40 on the substrate assembly 11A. Preferably, in the present disclosure, an area of the vertical projection of the molding area Z1 between the first barrier structure 2A' and the second barrier structure 2B' on the substrate assembly 11A is greater than an area of the vertical projection of the opening 40 on the substrate assembly 11A.

Thereafter, as shown in a step S1062, the molding resin 3A can be spread on the printing screen 4 so as to fill the molding resin 3A into the opening 40 of the printing screen 4 to cover part of the first array component set 12A and part of the second array component set 12B. It should be noted that, in a step of spreading the molding resin 3A on the printing screen 4 to fill the molding resin 3A into to the opening 40 of the printing screen 4, the molding resin 3A is spread under a vacuum environment with a predetermined vacuum pressure.

Thereafter, as shown in a step S1063, the molding resin 3A can be leveled down by a squeegee 5, so that the molding resin 3A can be uniformly scraped into the opening 40 of the printing screen 4 and on the molding area Z1. It should be noted that, in a preferred embodiment, since the area of the vertical projection of the molding area Z1 between the first barrier structure 2A' and the second barrier structure 2B' on the substrate assembly 11A is greater than the area of the vertical projection of the opening 40 on the substrate assembly 11A, the molding resin 3A would only cover part of the first array component set 12A and part of the second array component set 12B.

Thereafter, as shown in a step S1064, the printing screen 4 can be removed. In addition, it should be noted that, in the step S1063 or after the step S1064, the pressure level of the predetermined vacuum pressure of the vacuum environment can be increased. In other words, after the step of spreading the molding resin 3A on the printing screen 4 to fill the molding resin 3A into the opening 40 of the printing screen 4 under the vacuum environment of the predetermined vacuum pressure, the pressure level of the predetermined vacuum pressure of the vacuum environment can be increased to form a partial vacuum, such that the molding resin 3A can be compressed and more tightly covers the first array component set 12A and the second array component set 12B. Furthermore, in other embodiments, after a step of increasing the pressure level of the predetermined vacuum pressure of the vacuum environment to compress the molding resin 3A to more tightly cover the first array component set 12A and the second array component set 12B, the pressure level of the predetermined vacuum pressure of the vacuum environment can be adjusted to an atmospheric pressure level outside of the vacuum environment to break the vacuum.

Thereafter, as shown in a step S1065, the molding resin 3A can be cured to form the molding structure 3A' completely covering the first array component set 12A and the second array component set 12B. It should be noted that, in a step of curing the molding resin 3A, the molding resin 3A can be cured through spontaneous curing or thermal curing to form the cured and/or shaped molding structure 3A'. For instance, the thermal curing can be performed by baking. Furthermore, in the step of curing the molding resin 3A, the flowability of the molding resin 3A may be exploited to make the molding resin 3A flow to the first barrier structure 2A' and/or the second barrier structure 2B'. The first barrier structure 2A' and/or the second barrier structure 2B' may be used to block the moldable resin 3A and prevent the moldable resin 3A from flowing to the non-molding area Z2.

Following the foregoing descriptions, it should be noted that, the step of curing the molding resin 3A can include: heating the molding resin 3A to reduce the viscosity of the molding resin 3A, such that the molding resin 3A can completely cover the first array component set 12A and the second array component set 12B; and continuously heating the molding resin 3A to cure the same. However, the present disclosure is not limited thereby. In one of the embodiments, in the step of curing the molding resin 3A, the molding resin 3A can be heated by baking to reduce the viscosity of the molding resin 3A and further increase the flowability of the molding resin 3A, such that the molding resin 3A can completely cover the first array component set 12A and the second array component set 12B. The molding resin 3A is cured by continuous baking to form the molding structure 3A' completely covering the first array component set 12A and the second array component set 12B. In addition, in the process of heating the molding resin 3A by baking to reduce the viscosity of the molding resin 3A and increase the flowability thereof in order to make the molding resin 3A completely cover the first array component set 12A and the second array component set 12B, since the first barrier structure 2A' and the second barrier structure 2B' have been shaped on the substrate 11A, the first barrier structure 2A' and the second barrier structure 2B' would not flow under the effect of baking. Furthermore, it should be noted that, in the process of baking the molding resin 3A, the first barrier structure 2A' and the second barrier structure 2B' are baked simultaneously, so that the completely cured first structure 2A', the completely cured second barrier structure 2B' and the completely cured molding structure 3A' are formed.

Figure 15:
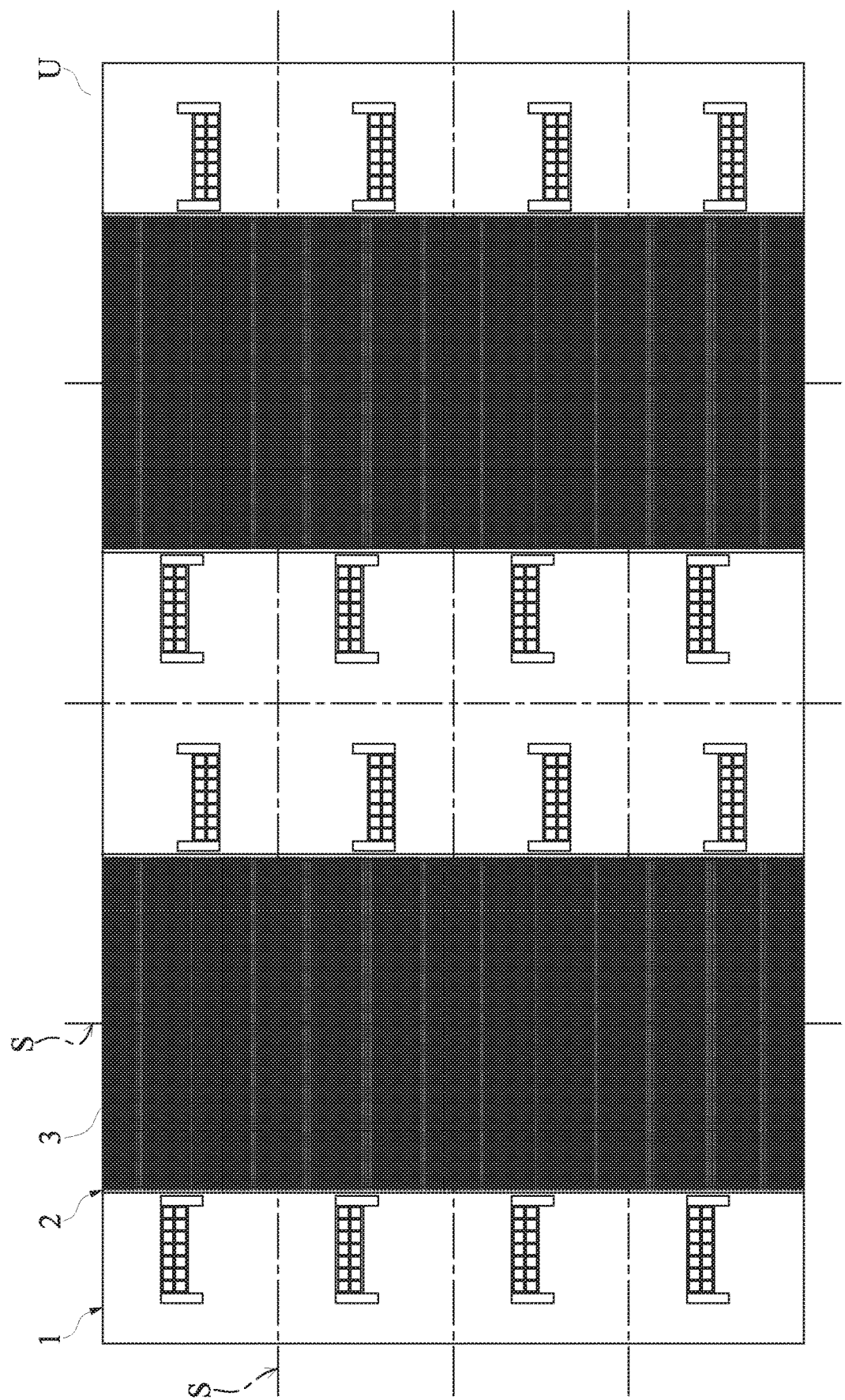
FIG. 15 is an even further another schematic view of the manufacturing process of the package structure according to the second embodiment of the present disclosure.
Figure 16:
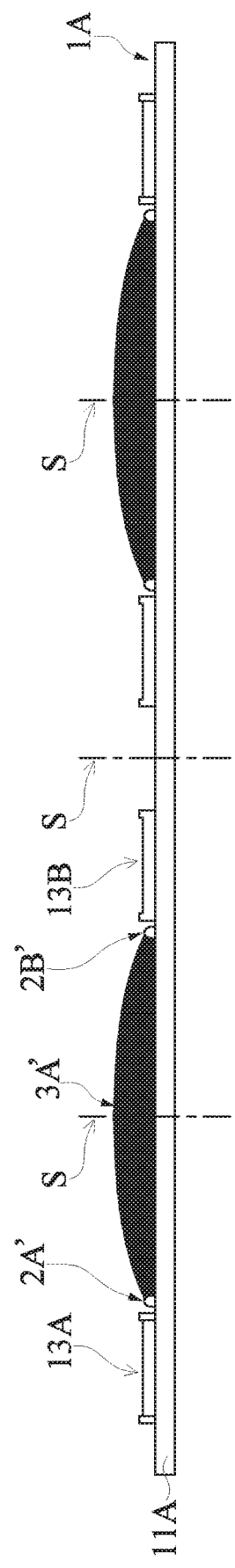
FIG. 16 is a front view of FIG. 15.

Thereafter, reference is made to FIG. 6, FIG. 15 and FIG. 16. As shown in a step S108, the substrate assembly 11A, the molding structure 3A', the first barrier structure 2A' and the second barrier structure 2B' can be cut to form a plurality of package structures U. For instance, the substrate assembly 11A, the molding structure 3A', the first barrier structure 2A' and the second barrier structure 2B' can be cut along a predetermined cutting line S to form the package structures U.

Thereafter, referring to FIG. 18 and FIG. 19, the package structures U shown in FIG. 18 and FIG. 19 are further formed according to the steps S1043 and S1044. From comparing FIG. 18 and FIG. 19 with FIG. 1 and FIG. 4, it can be seen that, in the embodiment of FIG. 18 and FIG. 19, the first predetermined height H1 of the barrier structure 2 can be further increased by using the third barrier resin 2AA and the fourth barrier resin 2BB. In addition, the amount of the molding layer 3 can be increased, such that the slope of the sloped top surface 35 can be gentler or the top surface 35 can substantially be a flat plane. Accordingly, the shape of the molding layer 3 of the package structures U is substantially a rectangle. However, it should be noted that, in the embodiment shown in FIG. 18 and FIG. 19, the first predetermined height H1 of the barrier structure 2 can be less than or equal to the second predetermined height H2 of the molding layer 3.

Beneficial Effects of Embodiments

In conclusion, one beneficial effect of the present disclosure is that the package structure and the manufacturing method thereof provided in the present disclosure can achieve selective packaging through the aspects of "a substrate 11 includes a molding area Z1 and a non-molding area Z2, and a component 12 is disposed on the molding area Z1 of the substrate 11" or "a substrate assembly 11A includes a molding area Z1 and a non-molding area Z2, and a first array component set 12A and a second array component set 12B are disposed on the molding area Z1".

Further, the package structure and the manufacturing method thereof provided in the present disclosure can achieve a configuration of the first predetermined height H1 of the barrier structure 2 of the package structures U being less than or equal to the second predetermined height H2 of the molding layer 3 through the aspects of "the area of a vertical projection of the molding area Z1 between a first barrier structure 2A' and a second barrier structure 2B' on the substrate assembly 11A is greater than the area of a vertical projection of an opening 40 on the substrate assembly 11A" in conjunction with exploiting the flowability of the molding resin 3A to make the molding resin 3A flow to the first barrier structure 2A' and/or the second barrier structure 2B', and the first barrier structure 2A' and/or the second barrier structure 2B' blocking the molding resin 3A to prevent it from flowing to the non-molding area Z2.

Furthermore, the barrier structure 2 and the molding layer 3 can be formed separately in the present disclosure, such that the package structures U can be miniaturized.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A package structure, comprising:
a circuit board including a substrate and a component disposed on the substrate, wherein the substrate includes a molding area and a non-molding area, the component is disposed on the molding area of the substrate, and the substrate includes a first side surface, a second side surface and a third side surface connected between the first side surface and the second side surface;
a barrier structure disposed on the substrate and located between the molding area and the non-molding area, wherein the barrier structure has a first predetermined height; and
a molding layer disposed on the molding area of the substrate and covering the component, wherein the molding layer has a second predetermined height, which is greater than or equal to the first predetermined height, the molding layer includes a first side face, a second side face, a third side face connected between the first side face and the second side face, and a fourth side face connected between the first side face and the second side face, and the fourth side face corresponds to the third side face;
wherein the first side surface, the second side surface and the third side surface are respectively flush with the first side face, the second side face and the third side face, and the barrier structure abuts against the fourth side face;
wherein the first predetermined height is less than the second predetermined height, the second predetermined height decreases from the third side face toward the fourth side face, and the closer to the barrier structure, the second predetermined height of the molding layer is lesser; and
wherein the molding layer includes a top face, the top face is connected between the first side face, the second side face, the third side face and the fourth side face, and a top surface of the molding layer is arced or curved to form a sloped top face.

2. The package structure according to claim 1, wherein the first predetermined height is greater than one third of the second predetermined height.

3. The package structure according to claim 1, wherein the barrier structure is made of a material different from a material of the molding layer.

4. The package structure according to claim 1, wherein the barrier structure abuts against the fourth side face and is not in contact with the third side face.

5. The package structure according to claim 1, wherein the barrier structure includes a first end face, a second end face corresponding to the first end face and an abutment face connected between the first end face and the second end face, and the abutment face abuts against the fourth side face, and wherein the first end face and the second end face are flush with the first side surface and the second side surface, respectively.

6. The package structure according to claim 1, wherein the circuit board further includes a member disposed on the non-molding area of the substrate.

* * * * *